(12) United States Patent
Schwamb et al.

(10) Patent No.: US 11,201,310 B2
(45) Date of Patent: Dec. 14, 2021

(54) OPTOELECTRONIC ASSEMBLY AND METHOD FOR PRODUCING AN OPTOELECTRONIC ASSEMBLY

(71) Applicant: PICTIVA DISPLAYS INTERNATIONAL LIMITED, Dublin (IE)

(72) Inventors: Philipp Schwamb, Regensburg (DE); Erwin Lang, Regensburg (DE); Arne Fleissner, Regensburg (DE)

(73) Assignee: Pictiva Displays International Limited, Dublin (IE)

( * ) Notice: Subject to any disclaimer, the term of this patent is extended or adjusted under 35 U.S.C. 154(b) by 110 days.

(21) Appl. No.: 15/512,075

(22) PCT Filed: Sep. 16, 2015

(86) PCT No.: PCT/EP2015/071253
§ 371 (c)(1),
(2) Date: Mar. 17, 2017

(87) PCT Pub. No.: WO2016/042042
PCT Pub. Date: Mar. 24, 2016

(65) Prior Publication Data
US 2017/0317310 A1 Nov. 2, 2017

(30) Foreign Application Priority Data
Sep. 17, 2014 (DE) .................... 10 2014 218 667.6

(51) Int. Cl.
*H01L 51/52* (2006.01)
*H01L 27/30* (2006.01)
(Continued)

(52) U.S. Cl.
CPC .......... *H01L 51/5212* (2013.01); *H01L 27/30* (2013.01); *H01L 27/3246* (2013.01);
(Continued)

(58) Field of Classification Search
CPC ............ H01L 27/3246; H01L 51/5212; H01L 27/3283; H01L 51/5203; H01L 51/441
See application file for complete search history.

(56) References Cited

U.S. PATENT DOCUMENTS

| 2003/0085654 A1* | 5/2003 | Hayashi | H01L 51/5253 313/506 |
| 2003/0129542 A1* | 7/2003 | Shih | B81C 1/0046 430/311 |

(Continued)

FOREIGN PATENT DOCUMENTS

| DE | 102012214248 A1 | 2/2014 |
| DE | 102012021691 A1 | 5/2014 |

(Continued)

OTHER PUBLICATIONS

German Search Report based on application No. 10 2014 218 667.6 (8 pages) dated Aug. 28, 2015 (for reference purpose only).
(Continued)

*Primary Examiner* — Tuan A Hoang
(74) *Attorney, Agent, or Firm* — Botos Churchill IP Law LLP

(57) ABSTRACT

An optoelectronic assembly including an optically active region configured for emitting and/or absorbing light, and an optically inactive region configured for component-external contacting of the optically active region is provided. The optically inactive region includes a dielectric structure and a first electrode on or above a substrate, an organic functional layer structure on the first electrode in physical contact with the first electrode and the dielectric structure, and a second electrode in physical contact with the organic functional layer structure and above the dielectric structure, wherein the organic functional layer structure at least partly overlaps the dielectric structure in such a way that the part of the
(Continued)

second electrode above the dielectric structure is free of a physical contact of the second electrode with the dielectric structure.

26 Claims, 8 Drawing Sheets

(51) Int. Cl.
*H01L 27/32* (2006.01)
*H01L 51/44* (2006.01)

(52) U.S. Cl.
CPC ...... *H01L 27/3276* (2013.01); *H01L 27/3283* (2013.01); *H01L 27/3288* (2013.01); *H01L 51/441* (2013.01); *H01L 51/448* (2013.01); *H01L 51/5203* (2013.01); *H01L 51/5243* (2013.01); *H01L 2251/5361* (2013.01)

(56) References Cited

U.S. PATENT DOCUMENTS

| | | | | |
|---|---|---|---|---|
| 2009/0256470 | A1* | 10/2009 | Naono | H01L 27/3276 313/504 |
| 2010/0244005 | A1* | 9/2010 | Gyoda | H01L 51/5237 257/40 |
| 2011/0101317 | A1* | 5/2011 | Gregory | H01L 27/3246 257/40 |
| 2012/0161115 | A1* | 6/2012 | Yamazaki | H01L 51/5218 257/40 |
| 2012/0205678 | A1* | 8/2012 | Ikeda | H01L 51/5203 257/88 |
| 2015/0207097 | A1 | 7/2015 | Reusch et al. | |
| 2015/0295201 | A1 | 10/2015 | Wehlus | |

FOREIGN PATENT DOCUMENTS

| | | | |
|---|---|---|---|
| DE | 102012221095 A1 | 5/2014 | |
| EP | 2693841 A1 * | 2/2014 | ......... H01L 51/5237 |
| EP | 2693841 A1 | 2/2014 | |
| WO | 2014023807 A2 | 2/2014 | |

OTHER PUBLICATIONS

International Search Report based on application No. PCT/EP2015/071253 (5 pages) dated Jul. 12, 2015 (for reference purpose only).

* cited by examiner

OPTOELECTRONIC ASSEMBLY AND METHOD FOR PRODUCING AN OPTOELECTRONIC ASSEMBLY

The invention relates to an optoelectronic assembly and to a method for producing an optoelectronic assembly.

A conventional optoelectronic assembly 500 (illustrated in FIG. 5 to FIG. 7) comprises an optically active region 516 and a contact region 518. A first electrode 506, an organic functional layer structure 508 and a second electrode 510 are formed on a substrate 502. A solderable electrically conductive layer 702, for example a Cr/Al/Cr layer, is usually formed in the contact region 518 on the material of the first electrode 506, illustrated in FIG. 7. Electrical busbars 704 are provided in the optically active region 516, said busbars being provided for increasing the current distribution in the optically active region 516.

The electrically conductive region 706 of the electrical busbar 704 is electrically insulated with respect to the organic functional layer structure 508 by means of a dielectric structure 504. Furthermore, a physical contact between the first electrode 506 and the second electrode 510 is prevented by means of a dielectric structure 504. Furthermore, in planar organic optoelectronic assemblies 500 it may be necessary for morphologies such as, for example, edges, steps or curvatures of different materials to be covered and encapsulated by molding, for example planarized, with further layers. By way of example, an electrical insulation is necessary in order to lead an electrically conductive layer over the edge of an insulating intermediate layer to a different plane within the device. This may be necessary in order, for example, to prevent electrical short-circuiting of the first electrode 506 with the second electrode 512 in the edge region of the planar organic optoelectronic assembly 500 and during operation.

The first electrode 506 and the second electrode 510 are exposed in the contact regions 518 of the optoelectronic assembly in order that these can be subjected to component-external electrical contacting. Usually, the second electrode 510 in the contact region 518 is formed partly in physical contact 512 with the dielectric structure 504. In the case of an optoelectronic assembly 500 in which the light is transmitted or absorbed by the second electrode 510, for example in the case of a so-called top emitter technology or in the case of a transparent optoelectronic assembly 700, the second electrode 510 is formed as transparent.

In a first method, a transparent second electrode 510 is formed from a relatively thick layer (100 nm or more) of a transparent electrically conductive material, for example a transparent conductive oxide (TOO). Alternatively, the second electrode is formed from a material that is non-transparent to visible light and has a thickness of a few 100 nm, and the light is emitted through the substrate.

In a second method, the second electrode 510 is formed from a thin layer of an electrically highly conductive material that is non-transparent per se, for example silver. In the second method, the second electrode 510 is formed for example with a thickness of less than 50 nm and is thus formed as transparent. It has been established that such a thin second electrode 510 in physical contact 512 with the dielectric structure 504 forms a dielectric region 514 with microstructures 602 or there is no contact between the second electrode 510 and the metal substrate 502 for current carrying or current distribution, illustrated in FIG. 6. As a result, a dielectric region 514 forms around the optically active region 516 and makes it more difficult for the contact region 518 to be electrically connected to the optically active region 516. The optoelectronic assembly 500 thus has an open circuit and is not ready for operation. That is to say that the materials—in physical contact—of the electrically conductive layers, for example electrodes 506, 510, and of the dielectric structure 504 of the optoelectronic assembly 500, with respect to the intended application, may have an insufficient adhesion to one another, trigger chemical reactions among one another, for example react chemically with one another; or a material may grow non-homogeneously on an underlying material.

As a result, the choice of materials for the electrically conductive layer and the electrically insulating layer is limited, for example in the region of the passivation layer or of the electrode materials of organic electronic devices. Specific material systems are conventionally used, for example polyimide as electrically insulating planarization material, which is very cost-intensive, however; or the use of electrode material having a relatively low reflectance, for example aluminum. Furthermore, an additional buffer material is used between the electrode material and the electrically insulating material.

The object of the invention is to provide an optoelectronic assembly having improved optical and/or electrical properties.

The object is achieved in accordance with one aspect of the invention by means of an optoelectronic assembly comprising an optically active region and an optically inactive region. The optically active region is configured for emitting and/or absorbing light. The optically inactive region is configured for component-external contacting of the optically active region. The optically inactive region comprises a dielectric structure, a first electrode, an organic functional layer structure and a second electrode. The dielectric structure and the first electrode are formed on or above a substrate. The organic functional layer structure is formed on the first electrode in physical contact with the first electrode and the dielectric structure. The second electrode is formed in physical contact with the organic functional layer structure and above the dielectric structure. The organic functional layer structure at least partly overlaps the dielectric structure in such a way that the part of the second electrode above the dielectric structure is free of a physical contact of the second electrode with the dielectric structure.

The organic functional layer structure formed in an overlapping fashion with respect to the dielectric structure makes it possible that a buffer layer between the second electrode and the dielectric structure or a material adaptation of the second electrode and the dielectric structure can be dispensed with. This is possible since the second electrode, in a manner governed by the application, is formed compatibly with regard to adhesion with respect to the organic functional layer structure. A buffer layer as adhesion promoter layer or reaction barrier is therefore optional between the second electrode and the dielectric structure. In other words: the second electrode can be formed as a thin, electrically conductive layer above the dielectric structure, wherein the second electrode, by means of the overlap of the organic functional layer structure, can be realized with a more homogeneous electrical conductivity and/or a higher transmittance than in similar conventional optoelectronic assemblies.

The optoelectronic assembly is for example a glass-based organic light emitting diode comprising a cost-effective, printable resist material (for the dielectric structure) and a highly reflective electrode, for example a silver electrode.

Alternatively, the optoelectronic assembly is a mechanically flexible organic light emitting diode comprising a cost-effective, printable planarization material.

The substrate is for example a metal film or a plastics film having a metallic conductor structure. The planarization material can be used for electrically insulating metal structures of the substrate. As a result, in the case where the light is emitted through the second electrode, that is to say in the case where a top emitter technology is used, the second electrode can be a thin metal electrode of a few nm, for example a silver-based electrode. The second electrode can be led onto the substrate for the purpose of current distribution and/or contacting and can wet said substrate.

Materials which are based for example on bisphenol-A and various derivatives thereof can be used cost-effectively as material for the dielectric structure.

Furthermore, the first electrode can be formed as an nm-thin, silver-based electrode on a glass-based substrate, for example in the case where the light is emitted and/or absorbed through the first electrode (bottom emitter technology). An internal coupling-out, that is to say a scattering structure within the encapsulation on or above the substrate, can additionally be provided.

The organic functional layer structure overlaps the dielectric structure in such a way that the dielectric structure, with respect to the second electrode, is free of exposed surface area on which the second electrode could or would be formed with regard to the function of the optoelectronic assembly. The organic functional layer structure molds around, overmolds, covers or surrounds the dielectric structure in order to overlap the latter. The overlapping of the dielectric structure by means of the organic functional layer structure can be effected horizontally and/or vertically with respect to the dielectric structure, for example laterally in the plane of the dielectric structure.

In accordance with one development, the optoelectronic assembly is formed as a component which emits light through the second electrode. This enables an optoelectronic component using so-called top emitter technology with a thin metallic second electrode. As a result, the second electrode has a high conductivity compared with an electrode composed of a transparent conductive oxide. In the case of a second electrode having a thickness of more than 100 nm, a dielectric region would not form in the electrode in the case of physical contact with the dielectric structure. However, a thicker electrode has a lower transmittance than a thin electrode. Additionally or alternatively, the thin second electrode therefore has a high transmittance compared with a thicker second electrode composed of the same material in physical contact with the dielectric structure.

In accordance with a further development, the optoelectronic assembly is formed as a transparent light emitting component. This enables a so-called multidirectionally light emitting, for example bi- or omnidirectionally light emitting, optoelectronic component comprising a thin second electrode.

In various exemplary embodiments, the term "translucent" or "translucent layer" can be understood to mean that a layer is transmissive to light, for example to the light generated by the light emitting component, for example in one or more wavelength ranges, for example to light in a wavelength range of visible light (for example at least in a partial range of the wavelength range of 380 nm to 780 nm). By way of example, in various exemplary embodiments, the term "translucent layer" should be understood to mean that substantially the entire quantity of light coupled into a structure (for example a layer) is also coupled out from the structure (for example layer), wherein part of the light can be scattered in this case.

In various exemplary embodiments, the term "transparent" or "transparent layer" can be understood to mean that a layer is transmissive to light (for example at least in a partial range of the wavelength range of 380 nm to 780 nm), wherein light coupled into a structure (for example a layer) is also coupled out from the structure (for example layer) substantially without scattering or light conversion Consequently, in various exemplary embodiments, "transparent" should be regarded as a special case of "translucent".

In accordance with yet another development, the optoelectronic assembly is formed as a transparent light emitting component. This enables a so-called multidirectionally light emitting, for example bi- or omnidirectionally light emitting, optoelectronic component comprising a thin second electrode.

In accordance with yet another development, the dielectric structure is formed as a planarization layer and/or as a hermetically impermeable barrier layer with regard to a diffusion of a substance that is harmful to the organic functional layer structure. This enables, since a dielectric structure has an electrically insulating effect, in addition to the electrically insulating effect, a planarizing effect, for example in order to provide a planar substrate surface for the first electrode, the organic functional layer structure and/or the second electrode.

A hermetically impermeable layer can have for example a diffusion rate with respect to water and/or oxygen of less than approximately $10^{-1}$ g/(m$^2$ d), and a hermetically impermeable cover and/or a hermetically impermeable carrier can have for example a diffusion rate with respect to water and/or oxygen of less than approximately $10^{-4}$ g/(m$^2$ d), for example in a range of approximately $10^{-4}$ g/(m$^2$ d) to approximately $10^{-10}$ g/(m$^2$ d), for example in a range of approximately $10^{-4}$ g/(m$^2$ d) to approximately $10^{-6}$ g/(m$^2$ d).

In accordance with yet another development, the dielectric structure is formed from a crosslinked material, preferably a crosslinked polymer. This makes it possible to form a mechanically stable, solid or fixed dielectric structure, for example with respect to the first electrode; with a relatively smooth surface. The dielectric structure thus substantially has a mechanical and electrical function in the optoelectronic assembly. The dielectric structure can be formed technically relatively simply by means of a crosslinking reaction on the substrate.

In accordance with yet another development, the organic functional layer structure is formed for emitting light from an electrical energy provided. Alternatively or additionally, the organic functional layer structure is formed for generating an electrical energy from an absorbed light.

In accordance with yet another development, the second electrode is formed as transparent with respect to the light emitted and/or absorbed by the organic functional layer structure. The second electrode formed as transparent is formed from a material that is transparent to visible light, for example a transparent conductive oxide, silver nanowires (Ag nanowires), carbon nanotubes; or a transparent conductive polymer or small molecules. Alternatively or additionally, the second electrode formed as transparent is formed with a relatively small thickness, in the case of which the decrease in intensity of the light being transmitted via the second electrode as a result of absorption losses in the second electrode is comparatively low. As a result, a second electrode composed of an inherently opaque material, for example silver, can be formed as transparent.

In accordance with yet another development, the second electrode has a thickness in a range of from approximately one monolayer to less than approximately 50 nm, for example less than approximately 30 nm, for example less than approximately 20 nm. As a result, a second electrode composed of an inherently opaque material, for example silver, can be formed as transparent.

In accordance with yet another development, the second electrode comprises or is formed from a metal, for example silver or a silver alloy, for example a magnesium:silver alloy. As a result, a second electrode can be formed from a highly conductive material.

In accordance with yet another development, the optically inactive region is arranged laterally alongside the optically active region.

In accordance with yet another development, the optoelectronic assembly furthermore comprises at least one contact pad which is electrically connected to the second electrode and is configured for component-external electrical contacting. A part of the organic functional layer structure is formed on the contact pad.

In accordance with a further development, a part of the dielectric structure is formed on the contact pad and is overlapped by the part of the organic functional layer structure on the contact pad.

The object is achieved in accordance with a further aspect of the invention by means of a method for producing an optoelectronic assembly, wherein the method comprises forming an optically active region configured for emitting and/or absorbing light; and forming an optically inactive region configured for component-external contacting of the optically active region. The optically inactive region is formed in such a way that: a dielectric structure and a first electrode are formed on or above a substrate; an organic functional layer structure is formed on the first electrode in physical contact with the first electrode and the dielectric structure; and a second electrode is formed in physical contact with the organic functional layer structure and above the dielectric structure; wherein the organic functional layer structure is formed such that it at least partly overlaps the dielectric structure, such that the part of the second electrode above the dielectric structure is free of a physical contact of the second electrode with the dielectric structure.

By virtue of the fact that the second electrode can be formed free of physical contact with the dielectric structure, the second electrode can be formed as a thin, electrically conductive layer above the dielectric structure, wherein the second electrode, by means of the overlap of the organic functional layer structure, can be realized with a more homogeneous electrical conductivity and/or a higher transmittance.

Exemplary embodiments of the invention are illustrated in the figures and are explained in greater detail below.

Figure 1:
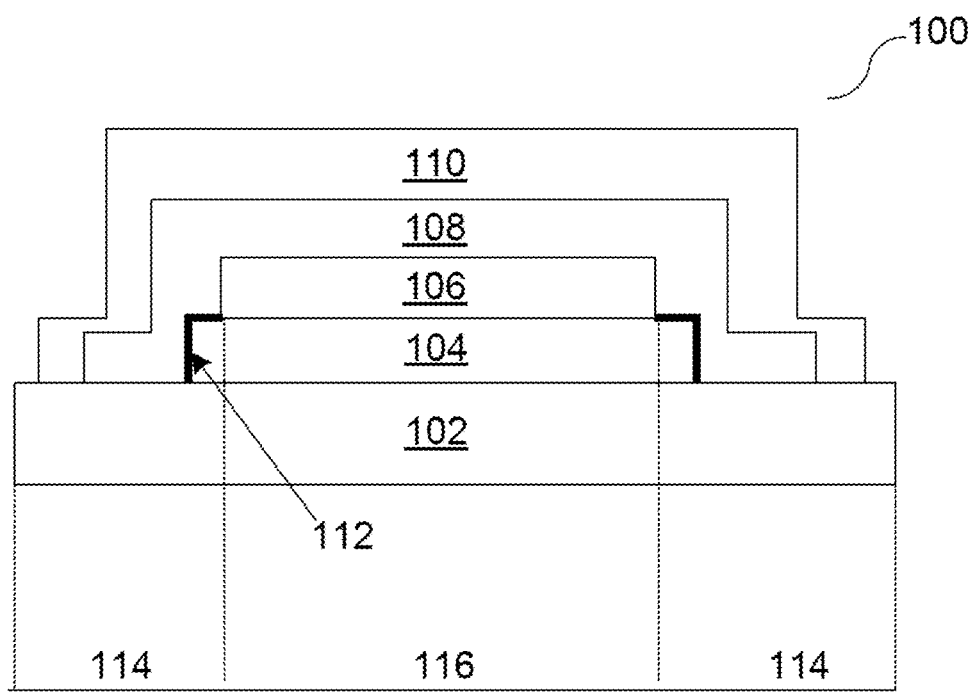
FIG. 1 shows a schematic sectional illustration of one exemplary embodiment of an optoelectronic assembly.

In the following detailed description, reference is made to the accompanying drawings, which form part of this description and show for illustration purposes specific exemplary embodiments in which the invention can be implemented. In this regard, direction terminology such as, for instance, "at the top", "at the bottom", "at the front", "at the back", "front", "rear", etc. is used with respect to the orientation of the figure(s) described. Since component parts of exemplary embodiments can be positioned in a number of different orientations, the direction terminology serves for illustration and is not restrictive in any way whatsoever. It goes without saying that other exemplary embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, in so far as this is expedient.

An optoelectronic assembly can comprise one, two or more optoelectronic components. Optionally, an optoelectronic assembly can also comprise one, two or more electronic components. An electronic component can comprise for example an active component and/or a passive component. An active electronic component can comprise for example a computing, control and/or regulating unit and/or a transistor. A passive electronic component can comprise for example a capacitor, a resistor, a diode or a coil.

An optoelectronic component can be an electromagnetic radiation emitting component or an electromagnetic radiation absorbing component. An electromagnetic radiation absorbing component can be for example a solar cell or a photodetector. In various exemplary embodiments, an electromagnetic radiation emitting component can be an electromagnetic radiation emitting semiconductor component and/or can be formed as an electromagnetic radiation emitting diode, as an organic electromagnetic radiation emitting diode, as an electromagnetic radiation emitting transistor or as an organic electromagnetic radiation emitting transistor. The radiation can be for example light in the visible range, UV light and/or infrared light. In this context, the electromagnetic radiation emitting component can be formed for example as a light emitting diode (LED), as an organic light emitting diode (OLED), as a light emitting transistor or as an organic light emitting transistor. In various exemplary embodiments, the light emitting component can be part of an integrated circuit. Furthermore, a plurality of light emitting components can be provided, for example in a manner accommodated in a common housing.

FIG. 1 illustrates one exemplary embodiment of an optoelectronic assembly 100. The optoelectronic assembly 100 comprises an optically active region 116 and an optically inactive region 114.

The optoelectronic assembly 100 comprises a substrate 102, a dielectric structure 104, a first electrode 106, an organic functional layer structure 108 and a second electrode 110.

The dielectric structure 104 is overmolded by the organic functional layer structure 108, such that the dielectric structure 104 is free of physical contact with the second electrode 110, for example in the use of the optoelectronic assembly.

Figure 5:
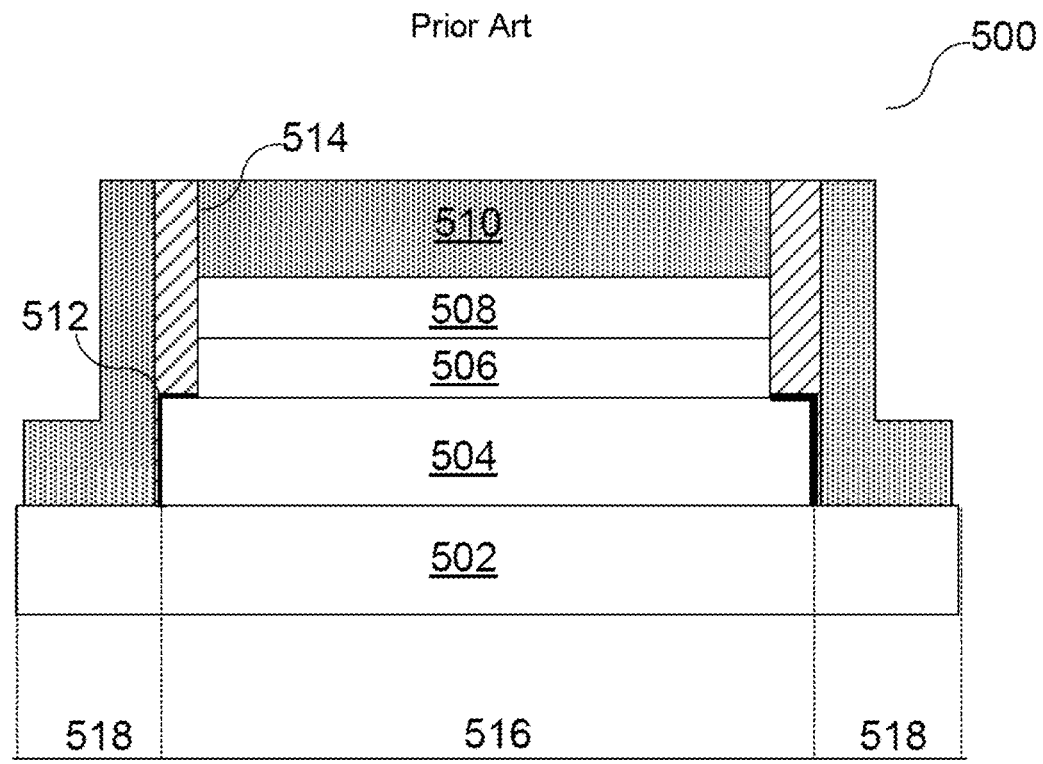
FIG. 5 shows a schematic sectional illustration of a conventional optoelectronic assembly.
Figure 6:
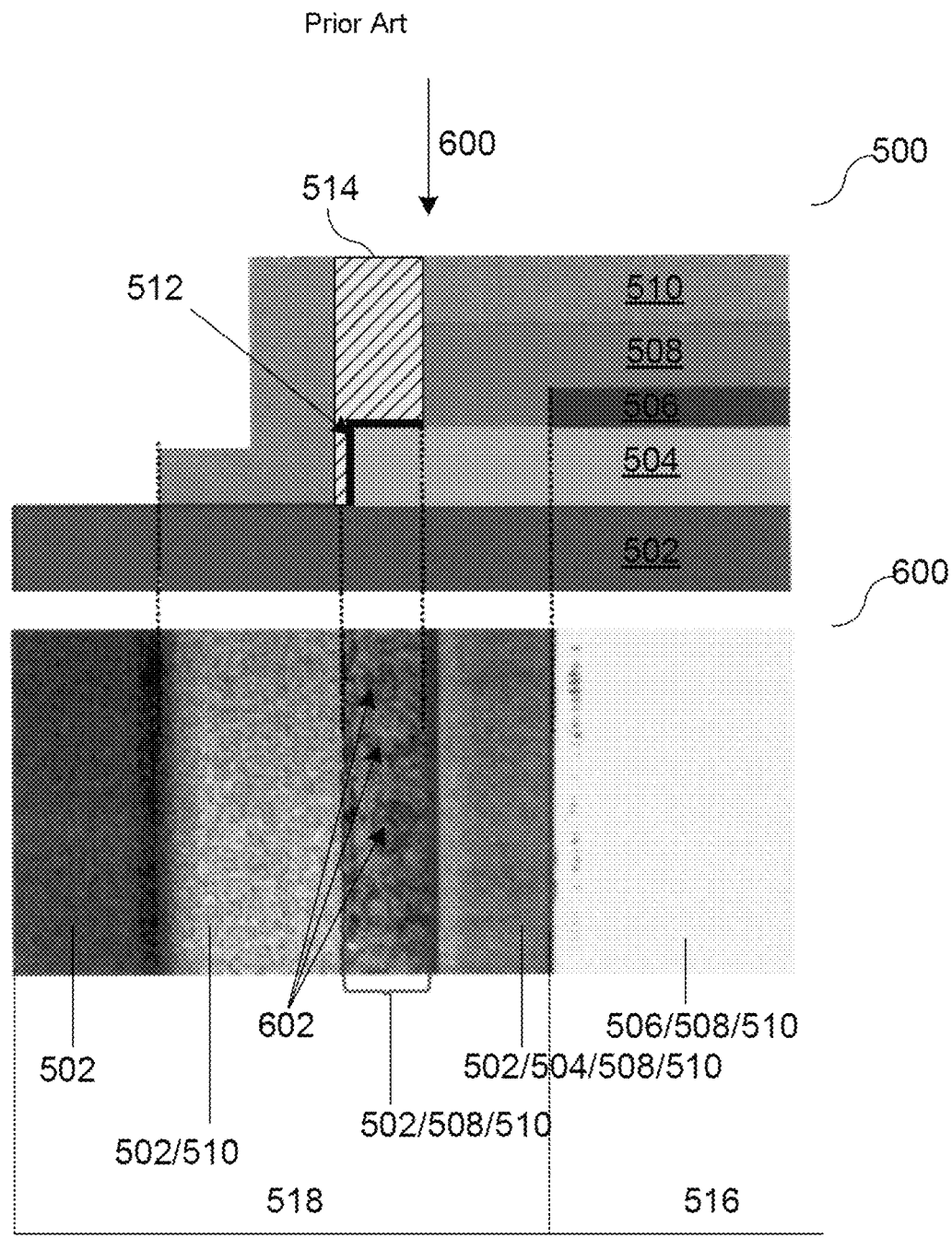
FIG. 6 shows a schematic sectional illustration of the optoelectronic assembly from FIG. 5 with a microscopic plan view.
Figure 7:
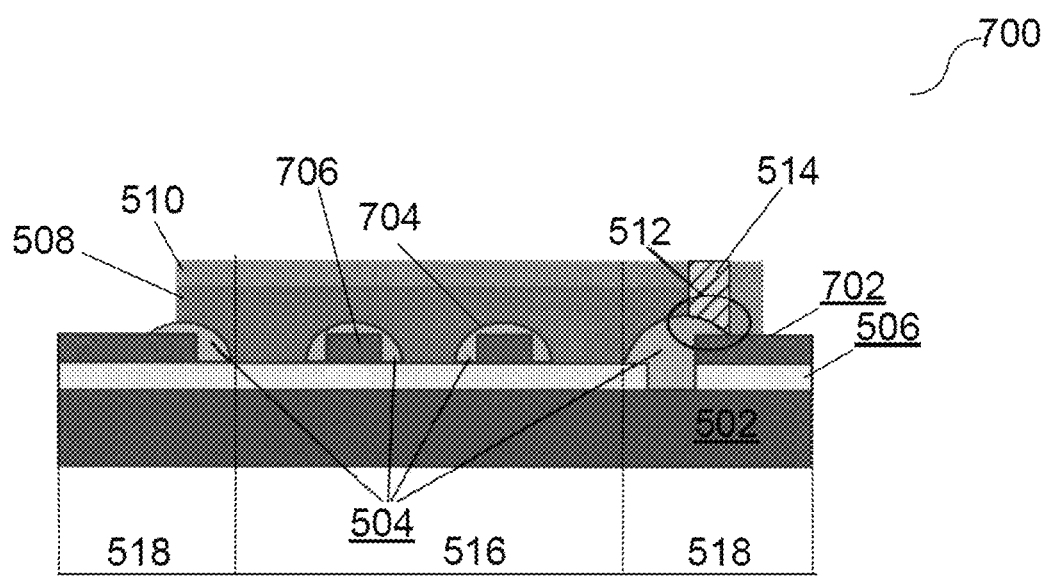
FIG. 7 shows a schematic sectional illustration of a further conventional optoelectronic assembly.

The second electrode 110, with respect to the function of the optoelectronic assembly 100, for example the wetting of the organic functional layer structure 108 with the second electrode 110, is already formed compatibly with respect to the organic functional layer structure 108. In the case of a conventional optoelectronic assembly (illustrated in FIG. 5 to FIG. 7), the second electrode covers the dielectric structure 104 with a physical contact 512. In the case of a thin second electrode, it would conventionally be necessary, therefore, to coordinate the materials of the second electrode 110 and of the dielectric structure 104 with one another with regard to adhesion and chemical reactivity. It is necessary independently of the dielectric structure 104, however, for the second electrode 110 to adhere on the organic functional layer structure 104. It is technically advantageous, therefore, since no material selection or material limitation is necessary, to form the organic functional layer structure 108 also above the dielectric structure 104, that is to say between the dielectric structure 104 and the second electrode 110. This makes it possible, for example, to use cost-effective materials for the dielectric structure 104, for example on the basis of bisphenol-A (BPA) or the derivatives thereof. Furthermore, this ensures that a closed circuit is formed between the second electrode 110 and an electrically conductive substrate 102, such that the optoelectronic assembly 100 is functionally ready.

The optically inactive region 114 is arranged laterally alongside the optically active region 116. The optically active region 116 is configured for emitting and/or absorbing light, as will be described in even greater detail below. The optically inactive region 114 is configured for electrical component-external contacting of the optically active region 116. By way of example, the optically inactive region 114 has exposed electrically conductive contact pads 308, 310 illustrated in FIG. 3, for example, which are configured for electrical contacting with an electrical component-external energy supply.

The organic functional layer structure 108 comprises a physical contact with the first electrode 106 and a physical contact 112 with the dielectric structure 104. The second electrode 110 is formed on the organic functional layer structure 108 and above the dielectric structure 104. The organic functional layer structure 108 overlaps the dielectric structure 104 in such a way that the dielectric structure 104 is free of a physical contact with the second electrode 110. The second electrode 110 has a physical contact with the organic functional layer structure 108. The organic functional layer structure 108 overlaps the regions of the dielectric structure 104 which are not already in the physical contact with the first electrode 106, illustrated with the reference sign 112 in FIG. 1.

The optoelectronic assembly 100 is formed in such a way that an electric current or an electrical energy is transported from the first electrode 106 through the organic functional layer structure 108 to the second electrode 110, or vice versa. By means of the electrical energy, light is emitted by the organic functional layer structure 108. Alternatively or additionally, light is absorbed in the organic functional layer structure and an electric current or an electrical energy is generated therefrom and transported to the electrodes 106, 110.

In Other Words:

In various exemplary embodiments, an optoelectronic assembly 100 comprises an optically active region 116 and an optically inactive region 114. The optically active region 116 is configured for emitting and/or absorbing light. The optically inactive region 114 is configured for component-external contacting of the optically active region. The optically inactive region 114 comprises a dielectric structure 104 and a first electrode 106 on or above a substrate 102. Furthermore, an organic functional layer structure 108 and a second electrode 110 are formed on or above the substrate 102. The organic functional layer structure 108 is formed on the first electrode 106 in physical contact with the first electrode 106 and the dielectric structure 104. The second electrode 110 is formed in physical contact with the organic functional layer structure 108 and above the dielectric structure 104. The organic functional layer structure 108 at least partly overlaps the dielectric structure 104 in such a way that the part of the second electrode 110 above the dielectric structure is free of a physical contact of the second electrode 110 with the dielectric structure 104.

The optoelectronic assembly 100 is formed as a component which emits light through the second electrode 110. Alternatively or additionally, the optoelectronic assembly 100 is formed as a transparent light emitting component. For this purpose, the substrate 102 should be formed as transparent with respect to the light absorbed and/or emitted by the optoelectronic assembly 100. The first electrode 106 is formed as reflective, for example for an optoelectronic assembly 100 of top emitter design. Alternatively, the first electrode 106 is formed as transparent with respect to the light emitted and/or absorbed by the organic functional layer structure 108, for example for a transparent optoelectronic assembly 100 or an optoelectronic assembly of bottom emitter design.

The substrate 102 is formed for example as a film or a sheet. Alternatively or additionally, the substrate 102 comprises or is formed from a glass or a plastic. The substrate 102 can be formed such that it is electrically conductive, for example as a metal film or a glass or plastics carrier having a conductor structure. The first electrode 106 and/or the second electrode 110 are/is electrically conductively connected to the electrically conductive substrate 102. As a result, for example, the first electrode 106 and/or the second electrode 110 can be contacted through the substrate 102, which simplifies the contacting of the optoelectronic assembly 100.

The substrate 102 comprises or is formed from glass, quartz and/or a semiconductor material. Alternatively or additionally, the substrate 102 comprises or is formed from a plastics film or a laminate comprising one or more plastics films.

The dielectric structure 104 is formed from a crosslinked material, for example a crosslinked polymer. The dielectric structure 104 is formed for example as a planarization layer and/or as a hermetically impermeable barrier layer with regard to a diffusion of a substance that is harmful to the organic functional layer structure. The dielectric structure 104 is formed as an electrically insulating structure with respect to a current flow from the first electrode 106 to the second electrode 110 through the dielectric structure 104.

Alternatively or additionally, the dielectric structure 104 is formed as an electrically insulating structure with respect to a current flow from the substrate 102 to the first electrode 106 and/or second electrode 110. The first electrode 106 can be separated from the second electrode 110 with respect to a physical contact by means of the dielectric structure 104. By virtue of the fact that the organic functional layer structure overlaps the dielectric structure 104, the first electrode 106 and the second electrode 110 are free of a physical contact with one another by means of the organic functional layer structure 108. Alternatively or additionally, the dielectric structure 104 is formed as an insulation island.

The second electrode 110 is arranged substantially parallel to the first electrode 106, for example apart from the region of the contact pads 308, 310 for component-external contacting.

The dielectric structure 104 can comprise or be formed from one or more of the following materials: a polyester, for example a polyhydroxyacetic acid, a polylactide, a polycaprolactone, a polyhydroxyalkanoate, a polyhydroxybutyric acid, a polyethylene terephthalate, a polybutylene terephthalate, a polytrimethyl terephthalate, a polyethylene naphthalate; a polysulfone, a polyether ketone, for example a polyether ether ketone, a polyether ketone ketone, a polycarbonate, an epoxy resin; a polyamide, a polyether sulfone, a polyarylate and a silicone, for example a polydimethylsilicone; a polyurethane, a polyacrylate, a polyimide.

The first electrode 106 comprises an electrically conductive material, for example a metal. Alternatively or additionally, the first electrode 106 comprises a transparent conductive oxide of one of the following materials: for example metal oxides: for example zinc oxide, tin oxide, cadmium oxide, titanium oxide, indium oxide, or indium tin oxide (ITO). The first electrode has a layer thickness in a range of from one monolayer to 500 nm, for example of from less than 25 nm to 250 nm, for example of from 50 nm to 100 nm.

The organic functional layer structure 108 is formed for emitting light from an electrical energy provided. Alternatively or additionally, the organic functional layer structure 108 is formed for generating an electrical energy from an absorbed light. The organic functional layer structure 108 can comprise a hole injection layer, a hole transport layer, an emitter layer, an electron transport layer and an electron injection layer. The layers of the organic functional layer structure 108 are arranged between the electrodes 106, 110 in such a way that during operation electrical charge carriers can flow from the first electrode 106 through the organic functional layer structure 108 into the second electrode 110, and vice versa. One or more of these layers overlaps the dielectric structure 104.

The layers of the organic functional layer structure 108 can be formed in accordance with conventional configurations in the case of an organic, electroluminescent structure.

The second electrode 110 is formed as transparent with respect to the light emitted and/or absorbed by the organic functional layer structure 108.

The second electrode 110 has a thickness in a range of from approximately one monolayer to less than approximately 50 nm, for example in a range of from approximately 1 nm to approximately 30 nm, for example in a range of from approximately 2 nm to approximately 20 nm, for example in a range of from approximately 5 nm to approximately 15 nm.

The second electrode 110 comprises or is formed from a metal, for example silver or a silver alloy, for example a magnesium:silver alloy.

The first electrode 106 and the second electrode 110 can be formed identically or differently. The second electrode 110 is formed as an anode, that is to say as a hole-injecting electrode, or as a cathode, that is to say as an electron-injecting electrode.

The dielectric structure 104, by means of the overlap of the organic functional layer structure, can be free of a physical contact with first electrode 106 and/or second electrode 110. The first electrode 106 can be formed in accordance with one of the configurations of the second electrode 110, and vice versa.

The electrode which, in physical contact with the dielectric structure 104, would form a dielectric region 514 in the electrode, that is to say the first electrode 106 and/or the second electrode, has a thickness in a range of from approximately one monolayer to approximately 1000 nm, for example in a range of from approximately 5 nm to approximately 100 nm, for example in a range of from approximately 2 nm to approximately 20 nm, for example in a range of from approximately 5 nm to approximately 15 nm. The electrode comprises or is formed from a material, for example in the form of an alloy; from one of the following materials: silver, magnesium, chromium, aluminum. The electrode is formed by one of the following methods: vapor deposition, cathode sputtering, ink jet printing, screen printing, intaglio printing, gravure printing, slot die coating method.

The dielectric structure 104 in the case of which the electrode, that is to say the first electrode 108 and/or the second electrode 110, would form a dielectric region 514 in the electrode has a thickness in a range of from approximately 50 nm to approximately 100 μm, for example in a range of from approximately 500 nm to approximately 50 μm, for example in a range of from approximately 1 μm to approximately 10 μm. The dielectric structure 104 comprises or is formed from a material from one of the following materials: a polyhydroxyacetic acid, a polylactide, a polycaprolactone, a polyhydroxyalkanoate, a polyhydroxybutyric acid, a polyethylene terephthalate, a polybutylene terephthalate, a polytrimethyl terephthalate, a polyethylene naphthalate; a polysulfone, a polyether ketone, for example a polyether ether ketone, a polyether ketone ketone, a polycarbonate, an epoxy resin; a polyamide, a polyether sulfone, a polyarylate and a silicone, for example a polydimethylsilicone; a polyurethane, a polyacrylate, a polyimide, an epoxy resin. The dielectric structure 104 is formed by one of the following methods: a printing method, ink jet printing, screen printing, intaglio printing; spin coating, wherein the material of the dielectric structure 104 in this case is applied over the whole area and is then structured back.

Furthermore, the optoelectronic assembly comprises an encapsulation structure on and above the substrate 102 (not illustrated). By means of the encapsulation structure, the first electrode, the organic functional layer structure and the second electrode are protected against indiffusion of a harmful substance. In other words: the encapsulation structure is formed as hermetically impermeable with respect to a diffusion of water and/or oxygen through the encapsulation structure into the organic functional layer structure 108. The encapsulation structure comprises for example a barrier thin-film layer, a coupling-out layer, a connection layer, a getter and/or a cover. The encapsulation structure can be formed on two or more sides with respect to the electrodes 106, 110 and the organic functional layer structure.

The barrier thin-film layer comprises or is formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The coupling-in/out layer comprises a matrix and, distributed therein, scattering centers with respect to the electromagnetic radiation, wherein the average refractive index of the coupling-in/out layer is greater or less than the average refractive index of the layer from which the electromagnetic radiation is provided. Furthermore, one or a plurality of antireflection layers (for example combined with the second barrier thin-film layer) can additionally be provided in the organic optoelectronic component 300.

The connection layer is formed from an adhesive or a lacquer. In one development, a connection layer composed of a transparent material comprises particles that scatter electromagnetic radiation, for example light-scattering particles. As a result, the connection layer acts as a scattering layer, which leads to an improvement in the color angle distortion and the coupling-out efficiency.

In one development, between the second electrode 110 and the connection layer an electrically insulating layer (not illustrated) is also formed, for example SiN, for example having a layer thickness in a range of from approximately 300 nm to approximately 1.5 µm, for example having a layer thickness in a range of from approximately 500 nm to approximately 1 µm, in order to protect electrically unstable materials, for example during a wet-chemical process.

The layer comprising getter comprises or is formed from a material that absorbs and binds substances that are harmful to the electrically active region, for example water vapor and/or oxygen. A getter comprises or is formed from a zeolite derivative, for example. The layer comprising getter has a layer thickness of greater than approximately 1 µm, for example a layer thickness of a plurality of µm.

The cover is formed or arranged on or above the connection layer. The cover is connected to the electrically active region by means of the connection layer and protects said region from harmful substances. The cover is for example a glass cover, a metal film cover or a sealed plastics film cover. The glass cover is connected for example by means of frit bonding (glass) by means of a conventional glass solder in the geometrical edge regions of the organic optoelectronic component.

Figure 2:
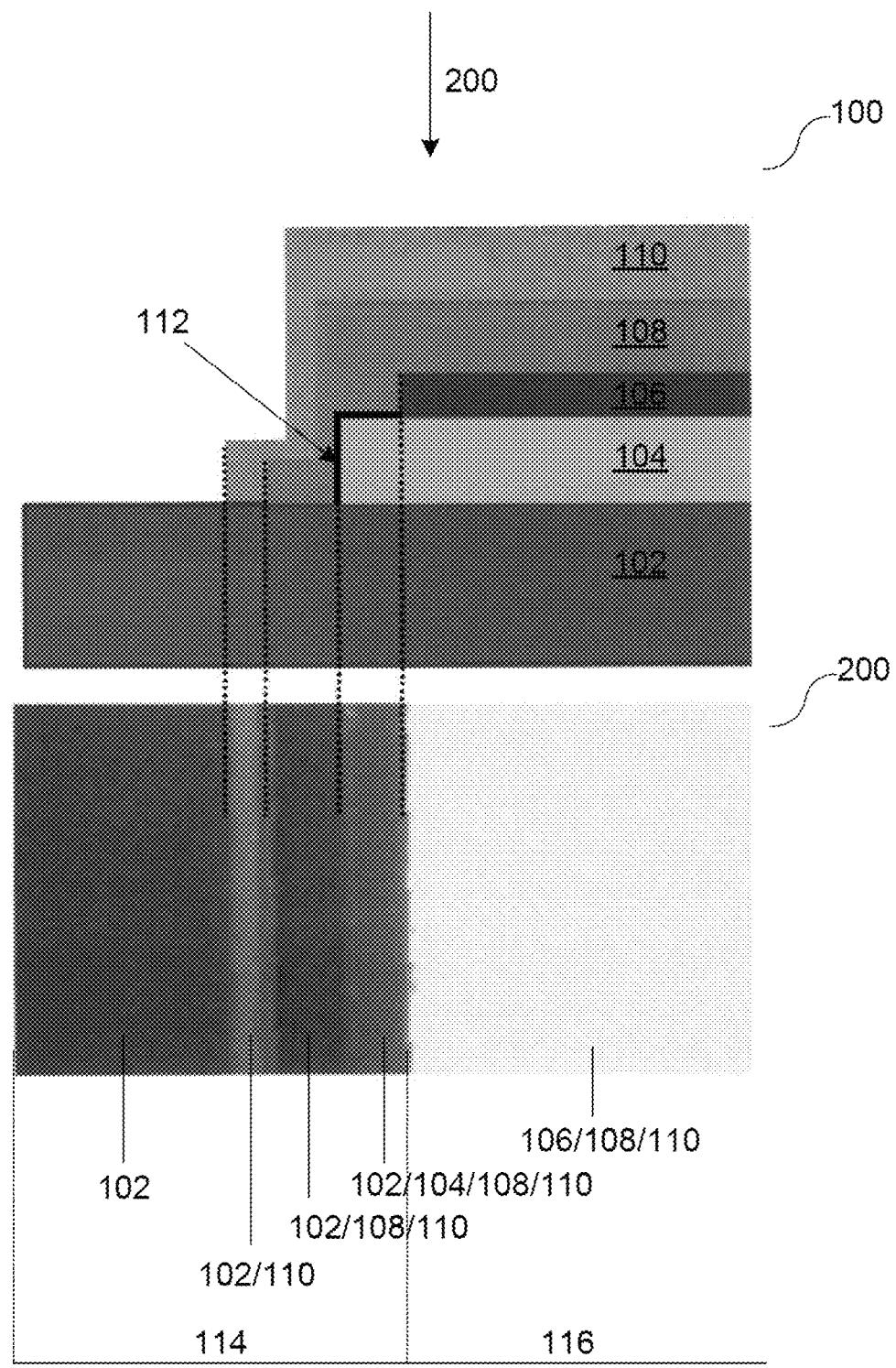
FIG. 2 shows a schematic sectional illustration of the exemplary embodiment of the optoelectronic assembly from FIG. 1 with a microscopic plan view.

FIG. 2 shows of an optoelectronic component. The optoelectronic component comprises . . . (mention all differences with respect to FIG. 1).

FIG. 2 illustrates one exemplary embodiment of an optoelectronic assembly which may for example largely correspond to the exemplary embodiment shown in FIG. 1. FIG. 2 illustrates a schematic side view (top) of the optoelectronic assembly and a microscopic plan view 200 (bottom) of the schematically illustrated optoelectronic assembly. In the example illustrated in FIG. 2, the optoelectronic assembly 100 is formed as an assembly which emits light through the second electrode 110. The first electrode 106 is formed from a reflective material, for example aluminum. The second electrode 110 is formed in transparent fashion, for example as a thin silver or silver-containing layer. The layers above the first electrode 106 are therefore formed as substantially transparent. As a result, only the first electrode 106 (illustrated as 106/108/110) can be discerned in the optically active region 116 in the plan view 200 of the optoelectronic component 100.

In the region above the dielectric structure 104 free of first electrode 106 (designated as 102/104/108/110 in FIG. 2), the substrate 102, the dielectric structure 104, the organic functional layer structure 108 and the second electrode 110 can be discerned, wherein the substrate is a reflective metal film.

By means of the region above the substrate 102 without a dielectric structure 104 (designated as 102/108/110 in FIG. 2) with organic functional layer structure 108 and second electrode 110, it is ensured that the dielectric structure 104 is free of a physical contact with the second electrode 110. It is evident from FIG. 2 in a comparison with FIG. 6 that the region of the second electrode 110 above the dielectric structure 104 is free of microscopic structures.

Furthermore, the substrate 102 and the region of the optoelectronic assembly 100 with substrate 102 and second electrode 110 (designated as 102/110 in FIG. 2) are illustrated.

The optically active region 116 of the optoelectronic assembly 100 is the region in which the second electrode 110, the organic functional layer structure 108 and the first electrode 106 overlap. The optically inactive region 114 is the region of the optoelectronic assembly 100 without an overlap of these three structures and is configured for electrical contacting of the optically active region.

Figure 3:
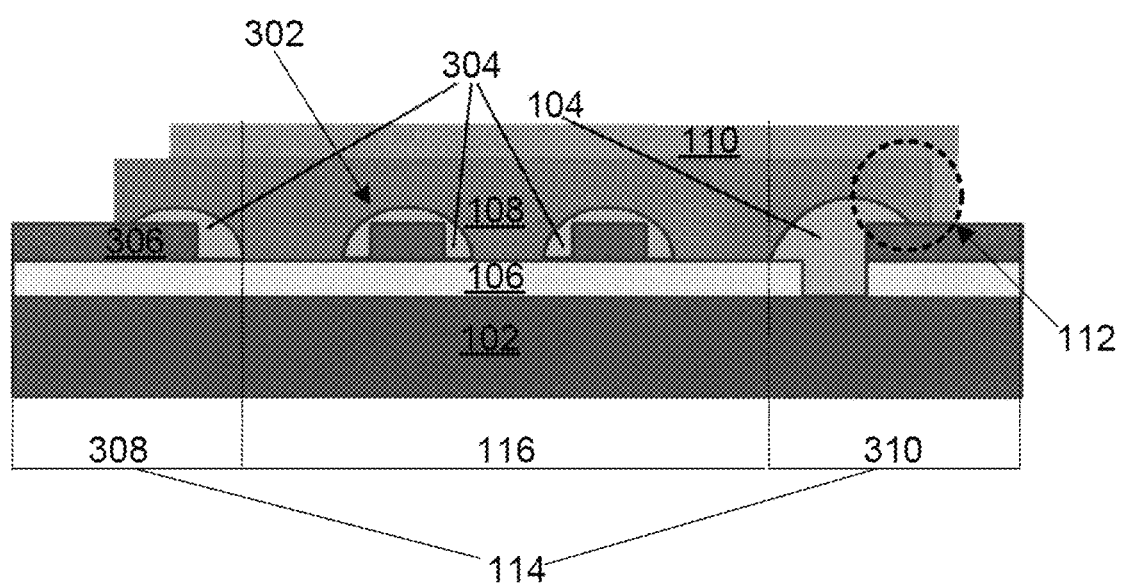
FIG. 3 shows a schematic sectional illustration of a further exemplary embodiment of an optoelectronic assembly.

FIG. 3 illustrates a further view or a further example of an optoelectronic assembly 300 which substantially corresponds to the above-described examples of the optoelectronic assembly 100.

In various exemplary embodiments, the optoelectronic assembly 100, 300 comprises electrical busbars 302 in the optically active region 116, said busbars being configured for distributing the electrical energy in the area of the optically active region 116, for example in the form of parallel lines.

The electrical busbars can comprise for example a structured, electrically conductive layer or layer structure on the first electrode, for example Cr/Al/Cr. For the case where the first electrode is formed from a transparent electrically conductive substance, with a relatively low transverse electrical conductivity, the electrical busbars increase the current distribution. For generating a homogeneous luminance distribution, the electrical busbars 302 are electrically insulated from the organic functional layer structure 108 by means of further dielectric structures 304.

In various exemplary embodiments, a solderable and/or electrically highly conductive layer 306 or layer sequence is formed on the first electrode 106, for example Cr/Al/Cr, Mo/Al/Mo, Mo/Ti, Al/Ti, Cu as described above in connection with the electrodes. The electrically highly conductive layer 306 may have for example a better solderability than the first electrode 106. The material of the electrically highly conductive layer may for example also be used for forming the electrically conductive structure of the electrical busbar 302, for example by virtue of the first electrode 106 and the electrically highly conductive layer 306 being formed in a structured fashion.

The further dielectric structure 304 insulates the electrically highly conductive layer 306 with respect to the organic functional layer structure 108 and the second electrode 110, since otherwise an electrical short circuit could arise.

The electrical busbars 304 are electrically conductively connected to the first electrode 106 and/or the second electrode 110. The second electrode is electrically connected to the electrical busbars by means of through contacts (vias), for example.

The contact region 114 comprises a first contact pad 310, which is electrically conductively connected to the first electrode 106; and a second contact pad 310, which is electrically conductively connected to the second electrode 110. The first contact pad 308 and the second contact pad 310 or the first electrode 106 and the second electrode 110 are electrically insulated from one another by means of the dielectric structure 104, for example illustrated in FIG. 8. In comparison with a conventional optoelectronic assembly (cf. FIG. 5 to FIG. 7), in the contact region 114 of the optoelectronic assembly 100 the organic functional layer structure 108 is formed in such a way that it overlaps the dielectric structure 104, which electrically insulates the electrodes or contact pads from one another.

Figure 8:
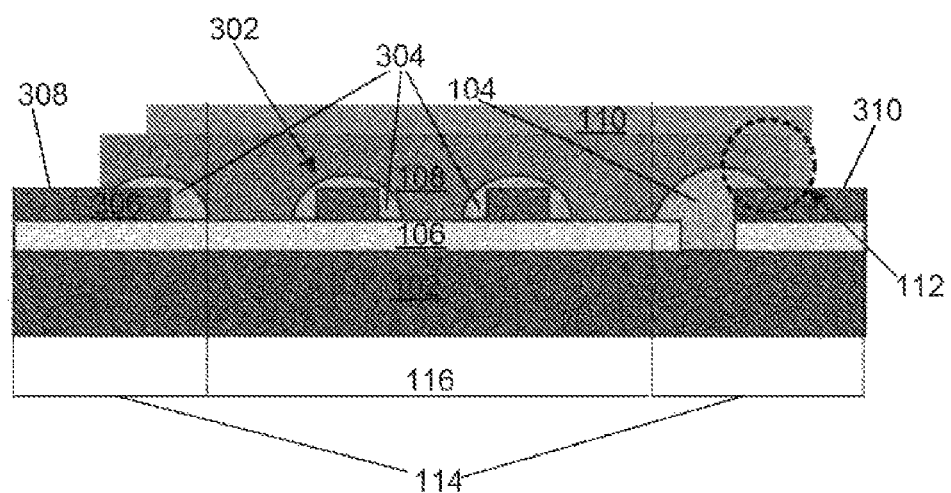
FIG. 8 shows a schematic sectional illustration of an alternative embodiment to the embodiment illustrated in FIG. 3.

A first electrical potential can be applied to the first contact pad 308 connected to the first electrode 106. The first electrical potential is provided by a component-external energy source, for example a current source or a voltage source. Alternatively, the first electrical potential is applied to an electrically conductive substrate 102 as illustrated in FIG. 8 and is fed electrically to the first electrode 106 indirectly through the substrate 102. The first electrical potential is for example the ground potential or some other predefined reference potential.

A second electrical potential can be applied to the second contact pad 310 connected to the second electrode 110. The second electrical potential is provided by the same energy source as, or a different energy source than, the first electrical potential. The second electrical potential is different than the first electrical potential. The second electrical potential has for example a value such that the difference with respect to the first electrical potential has a value in a range of from approximately 1.5 V to approximately 20 V, for example a value in a range of from approximately 2.5 V to approximately 15 V, for example a value in a range of from approximately 3 V to approximately 12 V.

In other words: the contact region 114 in the optically inactive region 114 comprises at least one second contact pad 310 which is electrically connected to the second electrode 110 and is configured for component-external electrical contacting. A part of the organic functional layer structure 108 is formed on the second contact pad. Furthermore, a part of the dielectric structure 104 can be formed on the second contact pad 314 (for example illustrated in FIG. 3) and can be overlapped by the part of the organic functional layer structure 108 on the contact pad.

Figure 4:
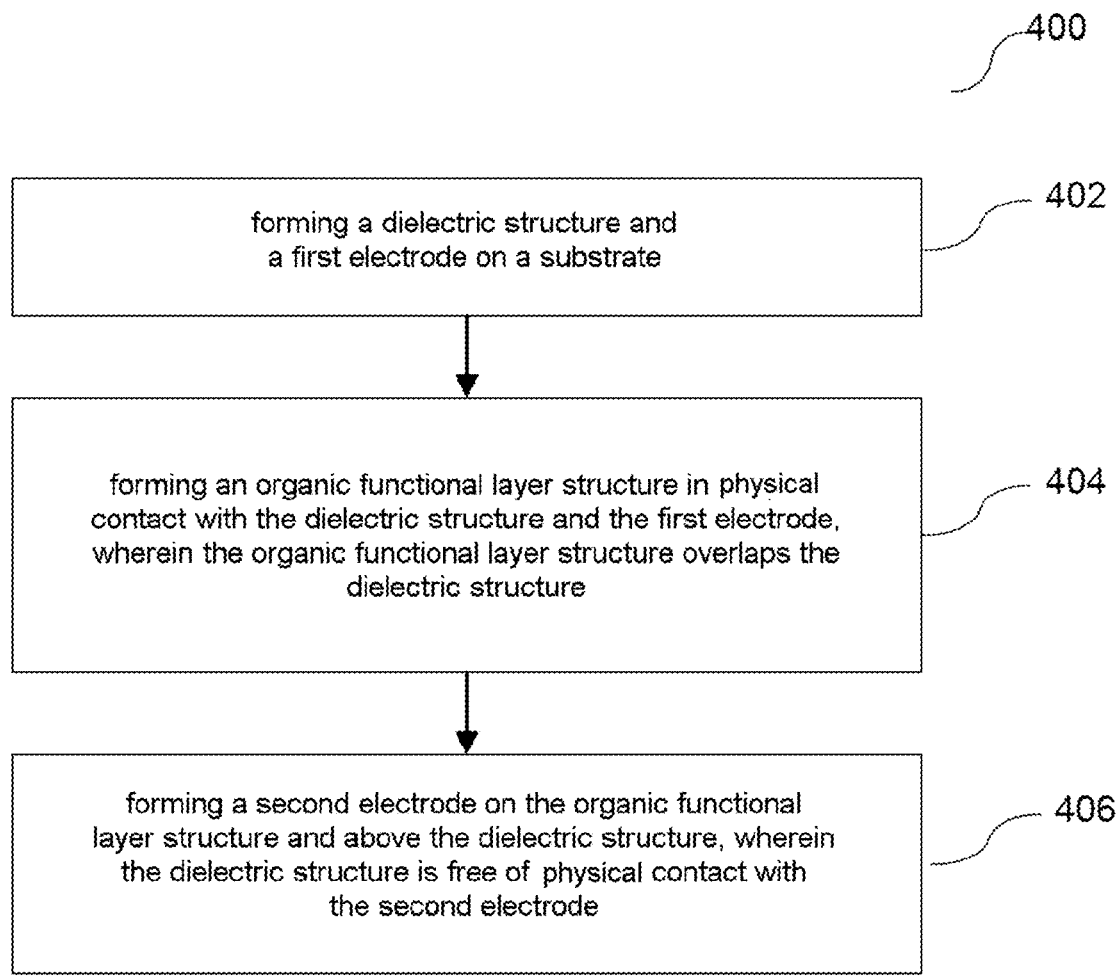
FIG. 4 shows a flow diagram of one exemplary embodiment of a method for producing an optoelectronic assembly.

FIG. 4 illustrates a flow diagram of a method for producing an optoelectronic assembly 100 explained in the preceding text, such as corresponds to an optoelectronic assembly 100 substantially described above.

The method 400 comprises forming 402 a dielectric structure 104 and a first electrode 106 on a substrate 102.

Furthermore, the method 400 comprises forming 404 an organic functional layer structure 108 in physical contact with the dielectric structure 104 and the first electrode 106. The organic functional layer structure is formed in such a way that it overlaps the dielectric structure 104.

Furthermore, the method 400 comprises forming 406 a second electrode 110 on the organic functional layer structure 108 and above the dielectric structure 104. The second electrode 110 is formed above the dielectric structure 104 and thus above the organic functional layer structure 108 in such a way that the dielectric structure 104 is free of a physical contact with the second electrode 110.

In other words: the method 400 for producing an optoelectronic assembly comprises forming an optically active region 116 configured for emitting and/or absorbing light; and forming an optically inactive region 114 configured for component-external contacting of the optically active region 116. The optically inactive region 114 is formed in such a way that a dielectric structure 104 and a first electrode 106 are formed 402 on or above a substrate 102; an organic functional layer structure 108 is formed 404 on the first electrode 106 in physical contact with the first electrode 106 and the dielectric structure 104; and a second electrode 110 is formed 406 in physical contact with the organic functional layer structure 108 and above the dielectric structure 104. The organic functional layer structure 108 is formed such that it at least partly overlaps the dielectric structure 104, such that the part of the second electrode 110 above the dielectric structure 104 is free of a physical contact of the second electrode 110 with the dielectric structure 104.

The organic functional layer structure 106 is formed after the dielectric structure 104 above the substrate 102, for example after the dielectric structure 104 has been cross-linked or cured. The organic functional structure can be formed in a deposition process, for example in a vapor deposition chamber, or as one layer. Alternatively, a plurality of, for example different, deposition processes and/or a plurality of layers are provided for the organic functional layer structure 108. The deposition processes can be carried out successively and the plurality of layers can be formed one on top of another and/or alongside one another.

The invention is not restricted to the exemplary embodiments indicated. By way of example, the dielectric structure can be formed on the first electrode or the first electrode can be formed on the dielectric structure. Consequently, the dielectric structure can be formed partly between the first electrode and the second electrode. Alternatively or additionally, the first electrode and the second electrode are formed partly on or above the dielectric structure.

The invention claimed is:

1. An optoelectronic assembly comprising:
an optically active region configured for emitting and/or absorbing light; and
an optically inactive region configured for component-external contacting of the optically active region;
wherein the optically active region comprises a first electrode on or above a substrate, an organic functional layer structure and a second electrode;
an electrically highly conductive layer formed on the first electrode;
wherein the optically inactive region comprises:
a dielectric structure on or above the substrate;
the organic functional layer structure on the first electrode in physical contact with the first electrode and the dielectric structure; and
the second electrode in physical contact with the organic functional layer structure and above the dielectric structure;
a further dielectric structure, wherein the further dielectric insulates a top surface and sidewalls of the electrically highly conductive layer,
at least one contact pad, disposed on the first electrode, and which is electrically connected to the second electrode and is configured for component external electrical contacting;
wherein a part of the organic functional layer structure and a part of the dielectric structure are overlapping with the contact pad; and wherein the organic functional layer structure and the dielectric structure are in physical contact with the contact pad.

2. The optoelectronic assembly as claimed in claim 1, wherein the optoelectronic assembly is formed as a component which emits light through the second electrode.

3. The optoelectronic assembly as claimed in claim 1, wherein the optoelectronic assembly is formed as a transparent light emitting component.

4. The optoelectronic assembly as claimed in claim 1, wherein the substrate is electrically conductive, and the first electrode and/or the second electrode are/is electrically conductively connected to the substrate.

5. The optoelectronic assembly as claimed in claim 1, wherein the dielectric structure is formed as a hermetically impermeable barrier layer with regard to a diffusion of a substance that is harmful to the organic functional layer structure.

6. The optoelectronic assembly as claimed in claim 1, wherein the dielectric structure is formed from a cross-linked material.

7. The optoelectronic assembly as claimed in claim 1, wherein the organic functional layer structure is formed for emitting light from an electrical energy provided; and/or
wherein the organic functional layer structure is formed for generating an electrical energy from an absorbed light.

8. The optoelectronic assembly as claimed in claim 1, wherein the second electrode is formed as transparent with respect to the light emitted and/or absorbed by the organic functional layer structure.

9. The optoelectronic assembly as claimed in claim 1, wherein the second electrode has a thickness in a range of from approximately one monolayer to less than approximately 50 nm.

10. The optoelectronic assembly as claimed in claim 1, wherein the optically inactive region is arranged laterally alongside the optically active region.

11. The optoelectronic assembly as claimed in claim 1, wherein the second electrode comprises or is formed from silver or a silver alloy.

12. The optoelectronic assembly as claimed in claim 1, wherein the second electrode comprises or is formed from a magnesium:silver alloy.

13. The optoelectronic assembly of claim 1, wherein the organic functional layer structure at least partially covers and overlaps the further dielectric structure.

14. The optoelectronic assembly as claimed in claim 1, wherein at least a portion of the second electrode physically contacts the substrate.

15. The optoelectronic assembly as claimed in claim 1, wherein the dielectric structure is based on bisphenol-A or derivatives thereof.

16. The optoelectronic assembly as claimed in claim 1, wherein the first electrode has a thickness in a range of from one monolayer to 250 nm.

17. An optoelectronic assembly comprising:
an optically active region configured for emitting and/or absorbing light; and
an optically inactive region configured for component-external contacting of the optically active region;
wherein the optically active region comprises a first electrode on or above a substrate, an organic functional layer structure and a second electrode; wherein the optically inactive region comprises:
a dielectric structure on or above the substrate;
the organic functional layer structure on the first electrode in physical contact with the first electrode; and
the second electrode in physical contact with the organic functional layer structure and above the dielectric structure;
wherein the organic functional layer structure at least partly overlaps the dielectric structure, and wherein the second electrode does not physically contact any sidewalls of the dielectric structure, and
wherein the first electrode is at least partially disposed on a surface of the dielectric structure facing away from the substrate, and wherein the dielectric structure is configured as a planarization layer providing a planar surface for the organic functional layer and wherein the organic functional layer is in physical contact with the substrates; and
wherein the dielectric structure is a continuously unperforated layer.

18. The optoelectronic assembly as claimed in claim 17, wherein the optoelectronic assembly is formed as a component which emits light through the second electrode.

19. The optoelectronic assembly as claimed in claim 17, wherein the optoelectronic assembly is formed as a transparent light emitting component.

20. The optoelectronic assembly as claimed in claim 17, wherein the substrate is electrically conductive, and the first electrode and/or the second electrode are/is electrically conductively connected to the substrate.

21. The optoelectronic assembly as claimed in claim 17, wherein the dielectric structure is formed as a hermetically impermeable barrier layer with regard to a diffusion of a substance that is harmful to the organic functional layer structure.

22. The optoelectronic assembly as claimed in claim 17, wherein the dielectric structure is formed from a crosslinked material.

23. The optoelectronic assembly as claimed in claim 17, wherein the organic functional layer structure is formed for emitting light from an electrical energy provided; and/or
wherein the organic functional layer structure is formed for generating an electrical energy from an absorbed light.

24. The optoelectronic assembly as claimed in claim 17, wherein the second electrode is formed as transparent with respect to the light emitted and/or absorbed by the organic functional layer structure.

25. The optoelectronic assembly as claimed in claim 17, wherein the second electrode has a thickness in a range of from approximately one monolayer to less than approximately 50 nm.

26. The optoelectronic assembly as claimed in claim 17, wherein the optically inactive region is arranged laterally alongside the optically active region.

* * * * *